(12) United States Patent
Chiang et al.

(10) Patent No.: US 11,315,647 B2
(45) Date of Patent: Apr. 26, 2022

(54) DEFECT DETECTION DURING PROGRAM VERIFY IN A MEMORY SUB-SYSTEM

(71) Applicant: Micron Technology, Inc., Boise, ID (US)

(72) Inventors: Pinchou Chiang, San Jose, CA (US); Arvind Muralidharan, Folsom, CA (US); James I. Esteves, El Dorado Hills, CA (US); Michele Piccardi, Cupertino, CA (US); Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/929,439

(22) Filed: May 1, 2020

(65) Prior Publication Data

US 2021/0343351 A1 Nov. 4, 2021

(51) Int. Cl.
*G11C 16/34* (2006.01)
*G11C 16/04* (2006.01)
*G11C 16/10* (2006.01)

(52) U.S. Cl.
CPC ...... *G11C 16/3459* (2013.01); *G11C 16/0483* (2013.01); *G11C 16/10* (2013.01)

(58) Field of Classification Search
None
See application file for complete search history.

(56) References Cited

U.S. PATENT DOCUMENTS

| 5,835,436 | A | 11/1998 | Ooishi | |
|---|---|---|---|---|
| 7,529,969 | B1 | 5/2009 | Patel et al. | |
| 7,675,776 | B2 | 3/2010 | Allen et al. | |
| 9,785,493 | B1 | 10/2017 | Zhang et al. | |
| 10,714,205 | B1* | 7/2020 | Fang | G11C 29/028 |
| 2008/0031061 | A1 | 2/2008 | Roohparvar | |
| 2009/0273984 | A1 | 11/2009 | Tanzawa | |
| 2012/0281479 | A1* | 11/2012 | Kochar | G11C 29/025 365/185.19 |

(Continued)

OTHER PUBLICATIONS

Fang et al. (U.S. Pat. No. 10,714,205), "10_714_205_Specification.pdf", Jun. 19, 2019, (specification with paragraph numbering) (Year: 2019).*

(Continued)

*Primary Examiner* — James G Norman
(74) *Attorney, Agent, or Firm* — Lowenstein Sandler LLP

(57) ABSTRACT

A memory device includes a memory array comprising a plurality of wordlines and a regulator circuit selectively coupled to the plurality of wordlines, wherein the regulator circuit is configured to perform a detection routine to sample a load current from a selected wordline of the plurality of wordlines and generate a measured output voltage, wherein the measured output voltage modulates with respect to the load current. The memory device further includes a comparator circuit coupled to the regulator circuit, wherein the comparator circuit is configured to generate a comparison result based on a difference between the measured output voltage and a reference voltage and a local media controller coupled to the comparator circuit, wherein the local media controller is configured to identify a presence of a defect on the selected wordline in response to the comparison result satisfying a threshold condition.

19 Claims, 8 Drawing Sheets

(56) References Cited

U.S. PATENT DOCUMENTS

| | | | |
|---|---|---|---|
| 2015/0071000 A1* | 3/2015 | Namai | G11C 29/025 365/185.17 |
| 2016/0064452 A1 | 3/2016 | Ueda et al. | |
| 2016/0232985 A1 | 8/2016 | Sabde et al. | |
| 2016/0267980 A1 | 9/2016 | Akamine et al. | |
| 2020/0357448 A1 | 11/2020 | Yip et al. | |

OTHER PUBLICATIONS

International Search Report and Written Opinion for International Application No. PCT/US2021/030318, dated Jul. 28, 2021, 14 pages.

\* cited by examiner

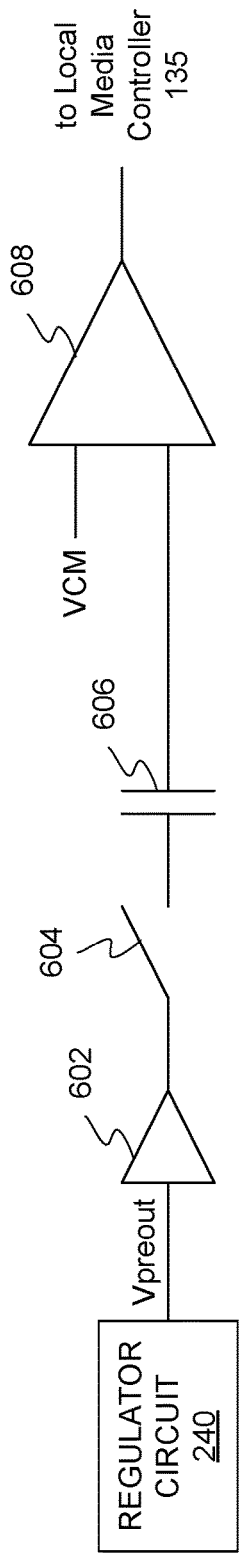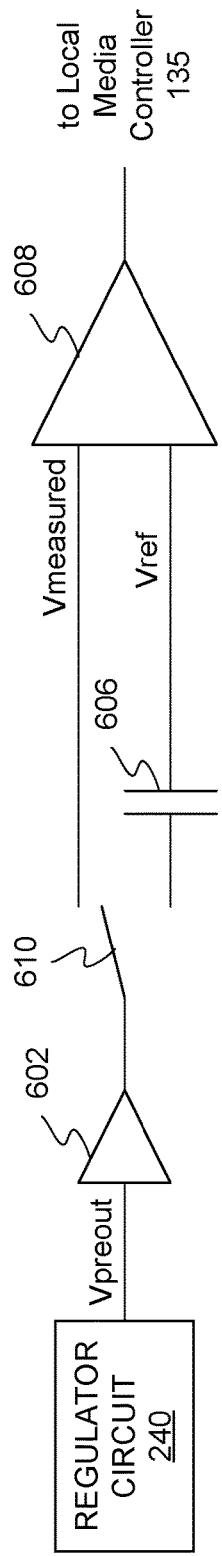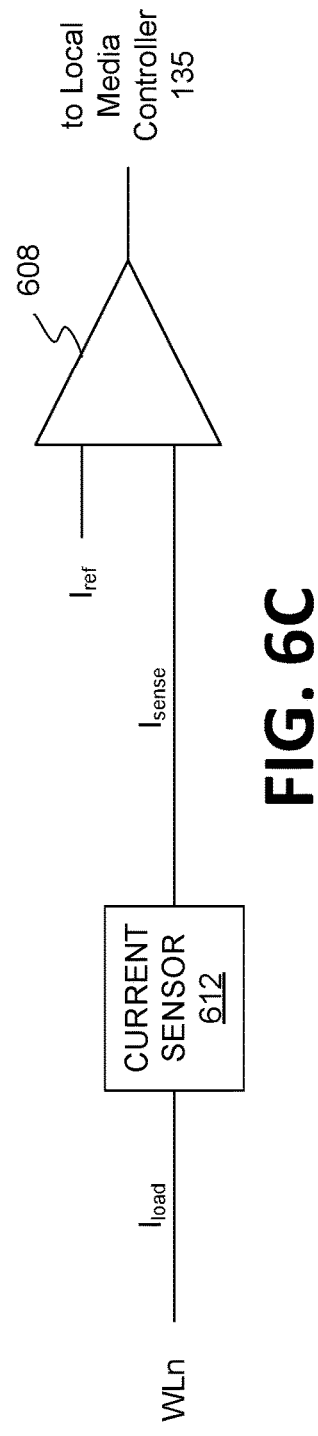

DEFECT DETECTION DURING PROGRAM VERIFY IN A MEMORY SUB-SYSTEM

TECHNICAL FIELD

Embodiments of the disclosure relate generally to memory sub-systems, and more specifically, relate to defect detection during program verify in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 6A-6C are circuit diagrams illustrating a comparator circuit for defect detection in a memory device in accordance with some embodiments of the present disclosure.

DETAILED DESCRIPTION

Figure 1:
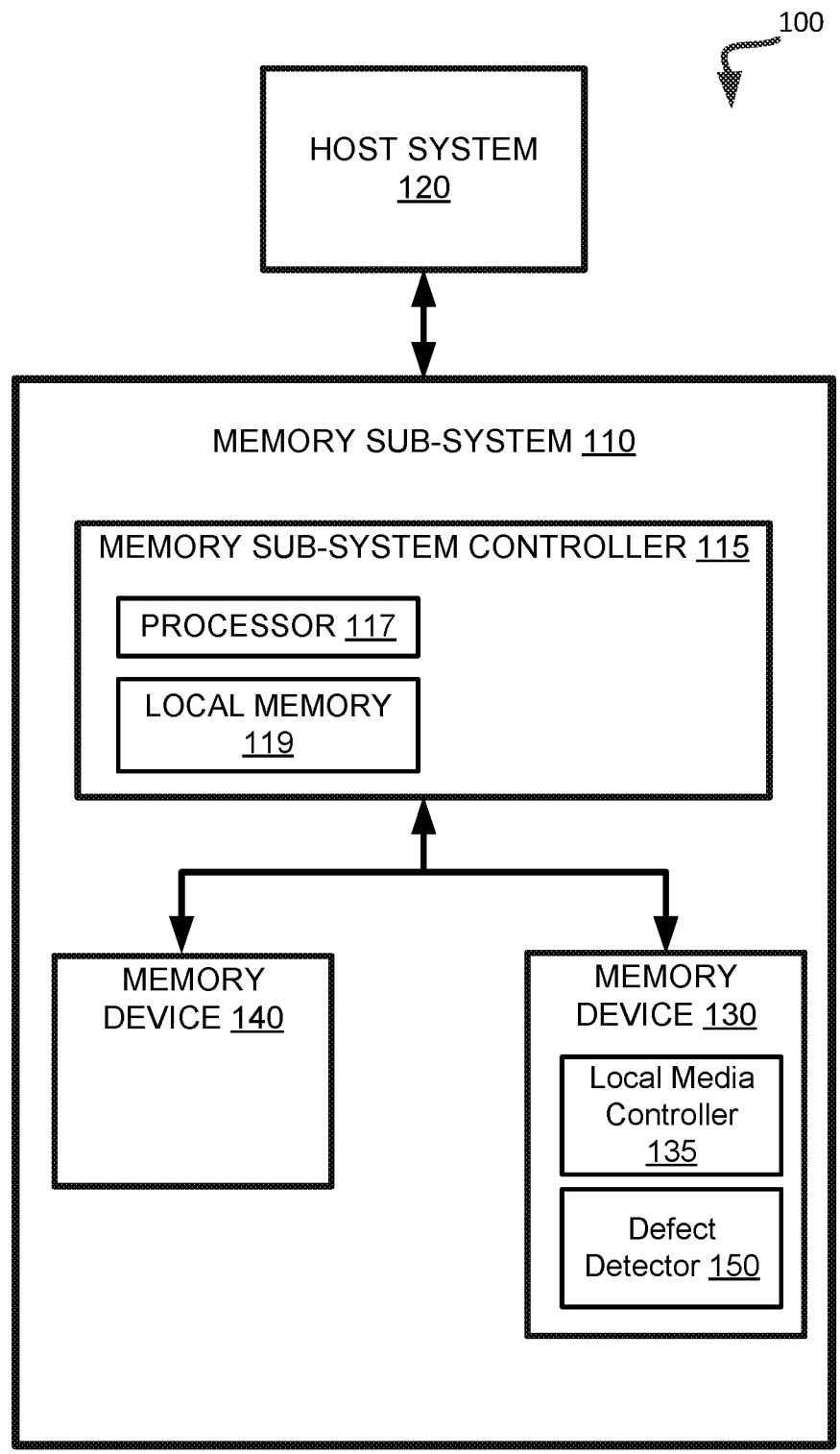
FIG. 1 illustrates an example computing system that includes a memory sub-system in accordance with some embodiments of the present disclosure.

Aspects of the present disclosure are directed to defect detection during program verify in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of a non-volatile memory device is a negative-and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

The memory sub-system further includes a memory sub-system controller that can communicate with the memory devices to perform operations such as reading data, writing data, or erasing data at the memory devices and other such operations. A memory sub-system controller is described in greater below in conjunction with FIG. 1. The operations can be performed in response to access requests (e.g., write commands, read commands) sent by a host system to the memory sub-system, such as to store data on a memory device of the memory sub-system and to read data from the memory device of the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. The metadata and host data, together, is hereinafter referred to as "payload." The operations can further be initiated by the memory sub-system as media management operations, which can include executing, for example, a write operation or read operation, on host data that is stored on a memory device. For example, the memory sub-system can re-write previously written host data from a location on a memory device to the same location or a new location as part of a write refresh operation. In another example, the media management operations can include a re-read of host data that is stored on a memory device as part of a read refresh operation.

As described above, a non-volatile memory device can include a number of individual blocks, each having a set of one or more wordlines that are used to access the memory cells of the block. Over time, as memory access operations, including program operations, read operations, and erase operations, are repeatedly performed on the blocks of the memory device, certain defects can develop. For example, an electrical short can develop between two adjacent wordlines. When a certain voltage, such as a program voltage, for example, is applied to one of those wordlines, a current is developed, at least a portion of which can flow through the electrical short and onto the adjacent wordline. This portion of the current can be referred to as a "leakage current." This leakage current can impact the logical values programed to or read from the memory cells connected to the associated wordlines leading to errors on the memory device. The memory sub-system can employ an error detection/correction engine capable of detecting and correcting a certain number of errors. Such detection/correction engines may use an error correction code (ECC) to detect and/or correct the errors. An ECC failure results when the detection/correction engine is not capable of correcting the errors within the data being read. This can be referred to as an uncorrectable ECC error (a UECC error). Certain physical defects, including a wordline to wordline short, are considered UECC errors and, responsive to detecting such an error, the memory sub-system can retire the corresponding block such that it is not used to store data going forward. In addition, in a multi-plane device, a defect in a block of one plane can also impact blocks in a neighboring plane, even if that neighboring plane does not have such a defect. Other defects besides a wordline to wordline short are also possible on the memory device.

When such a UECC error occurs while data is being written to the memory device during a program operation, all or a portion of the data can be incorrectly stored on the memory device. In addition, once the data being written is removed from any associated buffer, that data might be permanently lost. Certain conventional memory sub-systems attempt to detect defects on the memory device with limited success. For example, some systems monitor the operation of a charge pump configured to raise or lower the voltage applied to the wordlines of the memory device during memory access operations. When a wordline to wordline short is present on the memory device, the charge pump may have to work harder to reach a desired voltage level (e.g., a program voltage) because of the leakage current that flows across the short. The system can detect this overworking and conclude that a wordline to wordline short is present on the memory device. At low program voltages, however, the charge pump is generally strong enough to easily overcome leakage current that is not pronounced enough (i.e. if the short is not severe enough to cause the charge pump to overwork), such that the defect on the memory device might not be detected, leading to the possible loss of the data being programmed. Furthermore, in a multi-plane device, the charge pump is generally shared by multiple planes. Accordingly, even if any overworking of the charge pump is detected, the particular plane with the defect that caused the charge pump to overwork is not immediately known. Thus, the system must perform a separate operation to test each individual plane of the memory device to identify the particular plane with the defect. This leads to additional latency in detecting the defect and reduced bandwidth for performing other operations.

Aspects of the present disclosure address the above and other deficiencies by detecting defects in a memory array of a memory device detection during a program verify operation in a memory sub-system. In one embodiment, the memory sub-system initiates a program operation on a memory device, the program operation including a program phase and a program verify phase. During the program phase, a program voltage is applied to a selected wordline of a data block of the memory device to program data to a memory cell corresponding to the selected wordline. Subsequently, during the program verify phase, a verify voltage is applied to the selected wordline to read the data from the memory cell in order to confirm that this data was properly programed. Also, during the program verify phase, a defect detector on the memory device can measure a load current from the selected wordline, which can indicate whether a defect is present on the selected wordline. In one embodiment, a regulator circuit which is selectively coupled to the wordlines of the memory array performs a detection routine to sample the load current from the selected wordline and generate a measured output voltage. The design on the regulator circuit can be such that the measured output voltage modulates with respect to the load current. In one embodiment, a comparator circuit coupled to the regulator circuit is configured to generate a comparison result based on a difference between the measured output voltage and a reference voltage. This comparison result is provided to a local media controller which can identify a presence of a defect on the selected wordline in response to the comparison result satisfying a threshold condition. In one embodiment, if a wordline to wordline short is present in the memory array, a leakage current that flows through the electrical short can cause the load current from the selected wordline to change (e.g., decrease), which can lead to a change (e.g., decrease) in the measured output voltage of the regulator circuit. Thus, if the measured output voltage is less than the reference voltage by at least a threshold amount, the threshold condition can be satisfied and the local media controller can identify the presence of the defect. In response, the local media controller can take corresponding remedial action, such as retiring the corresponding block to prevent it from being used to store data in the future. In other embodiments, the defect detection operations described herein can be performed as part of a read operation initiated on the memory device.

Advantages of this approach include, but are not limited to, an improved sensitivity in the detection of defects in a memory device, including wordline to wordline shorts. The regulator circuit described herein can detect much smaller leakage currents indicating the presence of defects, which would have previously gone undetected using conventional solutions associated with the charge pump. In addition, by implementing these defect detection techniques during the program verify phase, certain defects can be detected much earlier in the lifecycle of a program operation, thereby preventing UECC errors and associated data loss. Furthermore, a separate defect detector can be used with each plane of a multi-plane memory device. In this arrangement, the plane on which a defect is present can be identified immediately by the corresponding defect detector, without the need for a second operation to test each individual plane. This reduces the latency in detecting the defect and preserves bandwidth of the local media controller for performing other operations on the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory device 130 includes a defect detector component 150 that can measure a load current from a selected wordline of a memory array of memory device 130 during a program verify phase of a program operation in order to detect whether a defect is present on the selected wordline, such as an electrical short between the selected wordline and an adjacent wordline. In one embodiment, the selected wordline is the wordline associated with one or more memory cells of the memory array on which the program operation is being performed. In one embodiment, after a program phase of the program operation, during which a program voltage is applied to the selected wordline to program data to a memory cell corresponding to the selected wordline a program verify voltage is applied to the selected wordline to read the data from the memory cell in order to confirm that this data was properly programmed. Also, during the program verify phase, defect detector component 150 can measure a load current from the selected wordline, which can indicate whether a defect is present on the selected wordline. In one embodiment, defect detector component 150 includes a regulator circuit which generates a measured output voltage that modulates with respect to the load current. Defect detector component 150 can further compare the measured output voltage to a reference voltage, where a difference between the measured output voltage and the reference voltage indicates whether a defect is present on the selected wordline. In another embodiment, defect detector component 150 can compare the reference voltage to a common mode voltage to generate a first result and compare the measured output voltage of the regulator circuit to the common mode voltage to generate a second result, where the difference between the first result and the second result indicates whether a defect is present on the selected wordline. In yet another embodiment, rather than generating a measured output voltage from the load current, defect detector component can directly compare the load current to a reference value, where a difference between the load current and the reference value indicates whether the defect is present on the selected wordline. In other embodiments, the defect detection operations described herein can be performed as part of a read operation initiated on the memory device. Further details with regards to the operations of defect detector component 150 are described below.

In some embodiments, the memory sub-system controller 115 includes at least a portion of defect detector component 150. For example, the memory sub-system controller 115 can include a processor 117 (e.g., a processing device) configured to execute instructions stored in local memory 119 for performing the operations described herein. In some embodiments, defect detector component 150 is part of the host system 120, an application, or an operating system. In other embodiments, local media controller 135 includes at least a portion of defect detector component 150 and is configured to perform the functionality described herein. In such an embodiment, detector component 150 can be implemented using hardware or as firmware, stored on memory device 130, executed by the control logic (e.g., local media controller 135) to perform the operations related to defect detection described herein.

Figure 2:
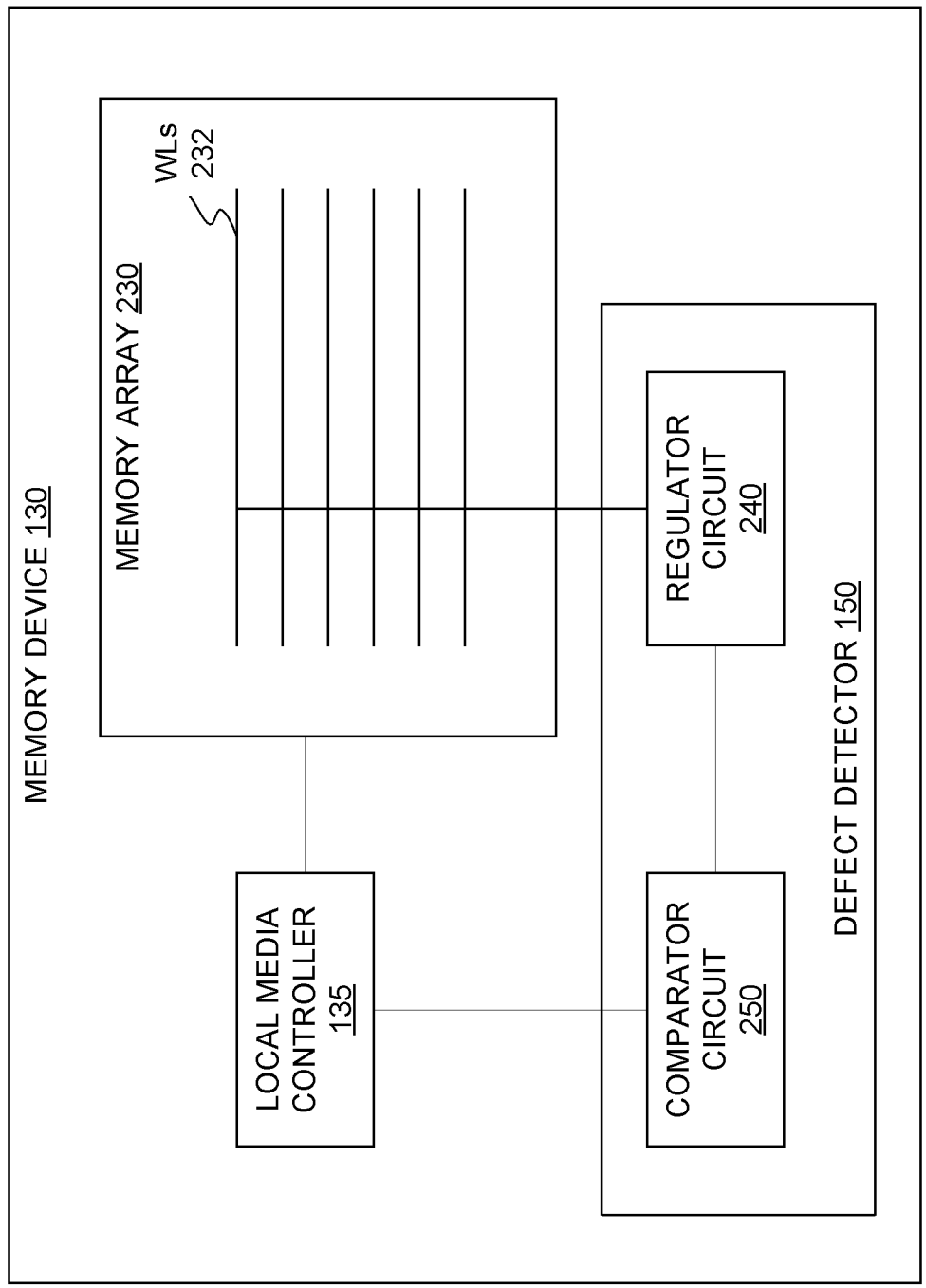
FIG. 2 is a block diagram illustrating a memory device including a defect detector component in accordance with some embodiments of the present disclosure.

FIG. 2 is a block diagram illustrating a memory device 130 including a defect detector component 150 in accordance with some embodiments of the present disclosure. In one embodiment, memory device 130 includes a memory array 230, defect detector component 150, and local media controller 135. Memory array 230 can include a number of layers of memory cells, each arranged in a two-dimensional grid. Each layer can include columns, also referred to as bitlines, and rows, also referred to as wordlines (WLs) 232. Each wordline 232 can refer to one or more rows of memory cells of a memory device that are used with one or more bitlines to generate the address of each of the memory cells. The intersection of a bitline and a wordline 232 constitutes the address of the memory cell. In one embodiment, memory array 230 can include multiple layers stacked vertically on top of one other to form a three-dimensional memory array.

A block refers to a unit of the memory device 130 used to store data and can include a group of memory cells, a wordline group, a wordline, or individual memory cells. One or more blocks can be grouped together to form a plane of the memory device 130 in order to allow concurrent operations to take place on each plane. The memory device 130 can include circuitry that performs concurrent memory page accesses of two or more memory planes. For example, the memory device 130 can include a respective access line driver circuit and power circuit for each plane of the memory device to facilitate concurrent access of pages of two or more memory planes, including different page types, as described in more detail below with respect to FIG. 3.

In one embodiment, defect detector component 150 is selectively coupled to each of the wordlines 232 of memory array 230. Memory device 130 can include circuitry (e.g., switches, multiplexer, etc.) to enable defect detector component 150 to sample a load current from each of the wordlines 232 of memory array 230 at different times. In one embodiment, defect detector component 150 can measure a load current from a selected wordline of memory array 230 during the program verify phase of a program operation being performed on one or more memory cells associated with the selected wordline. This load current can indicate whether a defect is present on the selected wordline, such as an electrical short between the selected wordline and an adjacent wordline of memory array 230. In another embodiment, defect detector component 150 can measure the load current from a selected wordline of memory array 230 during a read operation being performed on one or more memory cells associated with the selected wordline.

In one embodiment, defect detector component 150 includes regulator circuit 240 and comparator circuit 250. In one embodiment, regulator circuit 240 performs a calibration routine to establish a reference voltage. The reference voltage includes a reference output voltage of the regulator circuit 240 when the load current is not applied to the regulator circuit 240 (i.e., when regulator circuit 240 is disconnected from memory array 230). In one embodiment, at least one of regulator circuit 240 or comparator circuit 250 includes a storage component (e.g., a capacitor) to store the reference voltage until a detection routine is performed. In one embodiment, regulator circuit 240 performs the calibration routine after a program phase of a program operation and before the program verify phase is initiated. During the program verify phase, regulator circuit 240 performs a detection routine to sample a load current from the selected wordline of memory array 230 and generate a measured output voltage. In one embodiment, regulator circuit 240 includes a push-pull driver with an output stage (e.g., a source follower or common source). In one embodiment, the measured output voltage of regulator circuit 240 represents an operating point of a gate node of the output stage. The design of regulator circuit 240 can be such that the measured output voltage modulates with respect to the load current. Therefore, as the load current changes (e.g., decreases or increases), the measured output voltage also changes (e.g., proportionately decreases or increases). In one embodiment, regulator circuit 240 provides the reference voltage and the measured output voltage to comparator circuit 250.

In one embodiment, comparator circuit 250 generates a comparison result based on a difference between the measured output voltage and the reference voltage. In one embodiment, comparator circuit 250 directly compares the measured output voltage to the reference voltage, where the comparison result is the difference between the measured output voltage and the reference voltage. In another embodiment, comparator circuit 250 compares the reference voltage to a common mode voltage to generate a first result and compares the measured output voltage of regulator circuit 240 to the common mode voltage to generate a second result, where the comparison result is based on a difference between the first result and the second result. In yet another embodiment, comparator circuit 250 can receive the measured load current either directly from memory array 230 or from regulator circuit 240 and can compare the load current to a reference value, where the comparison result is the difference between the load current and the reference value. Regardless of how determined, comparator circuit 250 can provide the comparison result to local media controller 135 or other control logic of memory device 130.

In one embodiment, local media controller 135, which can be implemented using hardware or as firmware, stored on memory device 130, executed by control logic, can identify a presence of a defect on the selected wordline of memory array 230 in response to the comparison result satisfying a threshold condition. In one embodiment, if a wordline to wordline short is present in the memory array 230, a leakage current that flows through the electrical short can cause the load current from the selected wordline to change (e.g., decrease), which can lead to a change (e.g., decrease) in the measured output voltage of regulator circuit 240. Thus, if the measured output voltage is less than the reference voltage by at least a threshold amount, the threshold condition can be satisfied. Accordingly, in one embodiment, local media controller 135 can compare the comparison result to a threshold, and if the comparison result meets or exceeds the threshold, can identify the presence of the defect. In response, local media controller 135 can take corresponding remedial action, such as retiring the corresponding block to prevent it from being used to store data in the future.

Figure 3:
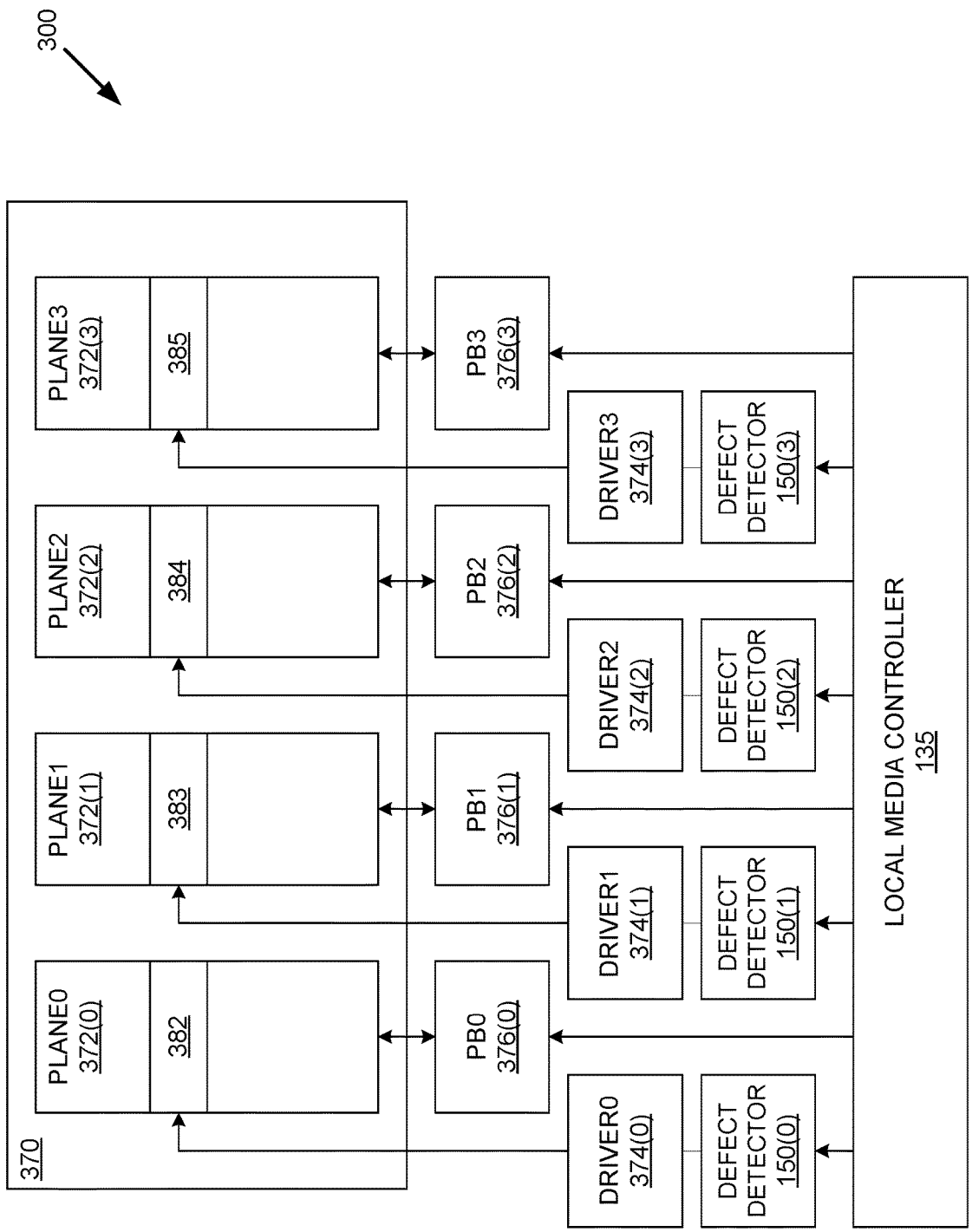
FIG. 3 is a block diagram illustrating a multi-plane memory device with per-plane defect detector components in accordance with some embodiments of the present disclosure.

FIG. 3 is a block diagram illustrating a multi-plane memory device 300 with per-plane defect detector components in accordance with some embodiments of the present disclosure. The memory device 300 includes a memory die 370 divided into memory planes 372(0)-372(3) that each includes a respective number of memory cells. In one embodiment, memory device 300 is representative of memory device 130 described above with respect to FIG. 1 and FIG. 2. The multi-plane memory device 300 can further include local media controller 135, including a power control circuit and access control circuit for concurrently performing memory access operations for different memory planes 372(0)-372(3). The memory cells can be non-volatile memory cells, such as NAND flash cells, or can generally be any type of memory cells.

The memory planes 372(0)-372(3) can each be divided into blocks of data, with a different relative block of data from each of the memory planes 372(0)-372(3) concurrently accessible during memory access operations. For example, during memory access operations, data block 382 of the memory plane 372(0), data block 383 of the memory plane 372(1), data block 384 of the memory plane 372(2), and data block 385 of the memory plane 372(3) can each be accessed concurrently.

Each of the memory planes 372(0)-372(3) can be coupled to a respective page buffer 376(0)-376(3). Each page buffer 376(0)-376(3) can be configured to provide data to or receive data from the respective memory plane 372(0)-372(3). The page buffers 376(0)-376(3) can be controlled by local media controller 135. Data received from the respective memory plane 372(0)-372(3) can be latched at the page buffers 376(0)-376(3), respectively, and retrieved by local media controller 135, and provided to the memory sub-system controller 115 via the NVMe interface.

Each of the memory planes 372(0)-372(3) can be further coupled to a respective access line driver circuit 374(0)-374(3), such as an access line driver circuit. The driver circuits 374(0)-374(3) can be configured to condition a page of a respective block of an associated memory plane 372(0)-372(3) for a memory access operation, such as programming data (i.e., writing data), reading data, or erasing data. Each of the driver circuits 374(0)-374(3) can be coupled to a respective global access lines associated with a respective memory plane 372(0)-372(3). Each of the global access lines can be selectively coupled to respective local access lines within a block of a plane during a memory access operation associated with a page within the block. The driver circuits 374(0)-374(3) can be controlled based on signals from local media controller 135. Each of the driver circuits 374(0)-374(3) can include or be coupled to a respective power circuit, and can provide voltages to respective access lines based on voltages provided by the respective power circuit. The voltages provided by the power circuits can be based on signals received from local media controller 135.

The local media controller 135 can control the driver circuits 374(0)-374(3) and page buffers 376(0)-376(3) to concurrently perform memory access operations associated with each of a group of memory command and address pairs (e.g., received from memory sub-system controller 115). For example, local media controller 135 can control the driver circuits 374(0)-374(3) and page buffer 376(0)-376(3) to perform the concurrent memory access operations. Local media controller 135 can include a power control circuit that serially configures two or more of the driver circuits 374(0)-374(3) for the concurrent memory access operations, and an access control circuit configured to control two or more of the page buffers 376(0)-376(3) to sense and latch data from the respective memory planes 372(0)-372(3), or program data to the respective memory planes 372(0)-372(3) to perform the concurrent memory access operations.

In operation, local media controller 135 can receive a group of memory command and address pairs via the NVMe bus, with each pair arriving in parallel or serially. In some examples, the group of memory command and address pairs can each be associated with different respective memory planes 372(0)-372(3) of the memory die 370. The local media controller 135 can be configured to perform concurrent memory access operations (e.g., read operations or program operations) for the different memory planes 372(0)-372(3) of the memory die 370 responsive to the group of memory command and address pairs. For example, the power control circuit of local media controller 135 can serially configure, for the concurrent memory access operations based on respective page type (e.g., UP, MP, LP, XP, SLC/MLC/TLC/QLC page), the driver circuits 374(0)-374(3) for two or more memory planes 372(0)-372(3) associated with the group of memory command and address pairs. After the access line driver circuits 374(0)-374(3) have been configured, the access control circuit of local media controller 135 can concurrently control the page buffers 376(0)-376(3) to access the respective pages of each of the two or more memory planes 372(0)-372(3) associated with the group of memory command and address pairs, such as retrieving data or writing data, during the concurrent memory access operations. For example, the access control circuit can concurrently (e.g., in parallel and/or contemporaneously) control the page buffers 376(0)-376(3) to charge/discharge bitlines, sense data from the two or more memory planes 372(0)-372(3), and/or latch the data.

Based on the signals received from local media controller 135, the driver circuits 374(0)-374(3) that are coupled to the memory planes 372(0)-372(3) associated with the group of memory command and address command pairs can select blocks of memory or memory cells from the associated memory plane 372(0)-372(3), for memory operations, such as read, program, and/or erase operations. The driver circuits 374(0)-374(3) can drive different respective global access lines associated with a respective memory plane 372(0)-372(3). As an example, the driver circuit 374(0) can drive a first voltage on a first global access line associated with the memory plane 372(0), the driver circuit 374(1) can drive a second voltage on a third global access line associated with the memory plane 372(1), the driver circuit 374(2) can drive a third voltage on a seventh global access line associated with the memory plane 372(2), etc., and other voltages can be driven on each of the remaining global access lines. In some examples, pass voltages can be provided on all access lines except an access line associated with a page of a memory plane 372(0)-372(3) to be accessed. The local media controller 135, the driver circuits 374(0)-374(3) can allow different respective pages, and the page buffers 376(0)-376(3) within different respective blocks of memory cells, to be accessed concurrently. For example, a first page of a first block of a first memory plane can be accessed concurrently with a second page of a second block of a second memory plane, regardless of page type.

The page buffers 376(0)-376(3) can provide data to or receive data from the local media controller 135 during the memory access operations responsive to signals from the local media controller 135 and the respective memory planes 372(0)-372(3). The local media controller 135 can provide the received data to memory sub-system controller 115.

It will be appreciated that the memory device 300 can include more or less than four memory planes, driver circuits, and page buffers. It will also be appreciated that the respective global access lines can include 8, 16, 32, 64, 128, etc., global access lines. The local media controller 135 and the driver circuits 374(0)-374(3) can concurrently access different respective pages within different respective blocks of different memory planes when the different respective pages are of a different page type.

In one embodiment, memory device can include a separate defect detector component 150(0)-150(3) for each of memory planes 372(0)-372(3). In one embodiment, each defect detector component 150(0)-150(3) includes a corresponding regulator circuit 240 and comparator circuit 250. In another embodiment, each defect detector component 150(0)-150(3) includes a corresponding regulator circuit 240 and there is a common comparator circuit 250 shared by each defect detector component 150(0)-150(3). As described above, whenever a program operation is initiated on one of memory planes 372(0)-372(3), the corresponding one of driver circuits 374(0)-374(3) can apply a program voltage to a selected wordline during a program phase. Subsequently, during a program verify phase, the corresponding one of driver circuits 374(0)-374(3) can apply a program verify voltage to the selected wordline. Also during the program verify phase, a corresponding one of defect detector components 150(0)-150(3) can measure a load current from the selected wordline on the corresponding one of memory planes 372(0)-372(3) and use the measured load current to determine whether a defect, such as a wordline to wordline short, is present on the corresponding memory plane according to the techniques described herein. Since each of memory planes 372(0)-372(3) includes a separate defect detector component 150(0)-150(3), the plane on which a defect is present can be identified immediately, without the need for a second operation to test each individual memory plane.

Figure 4:
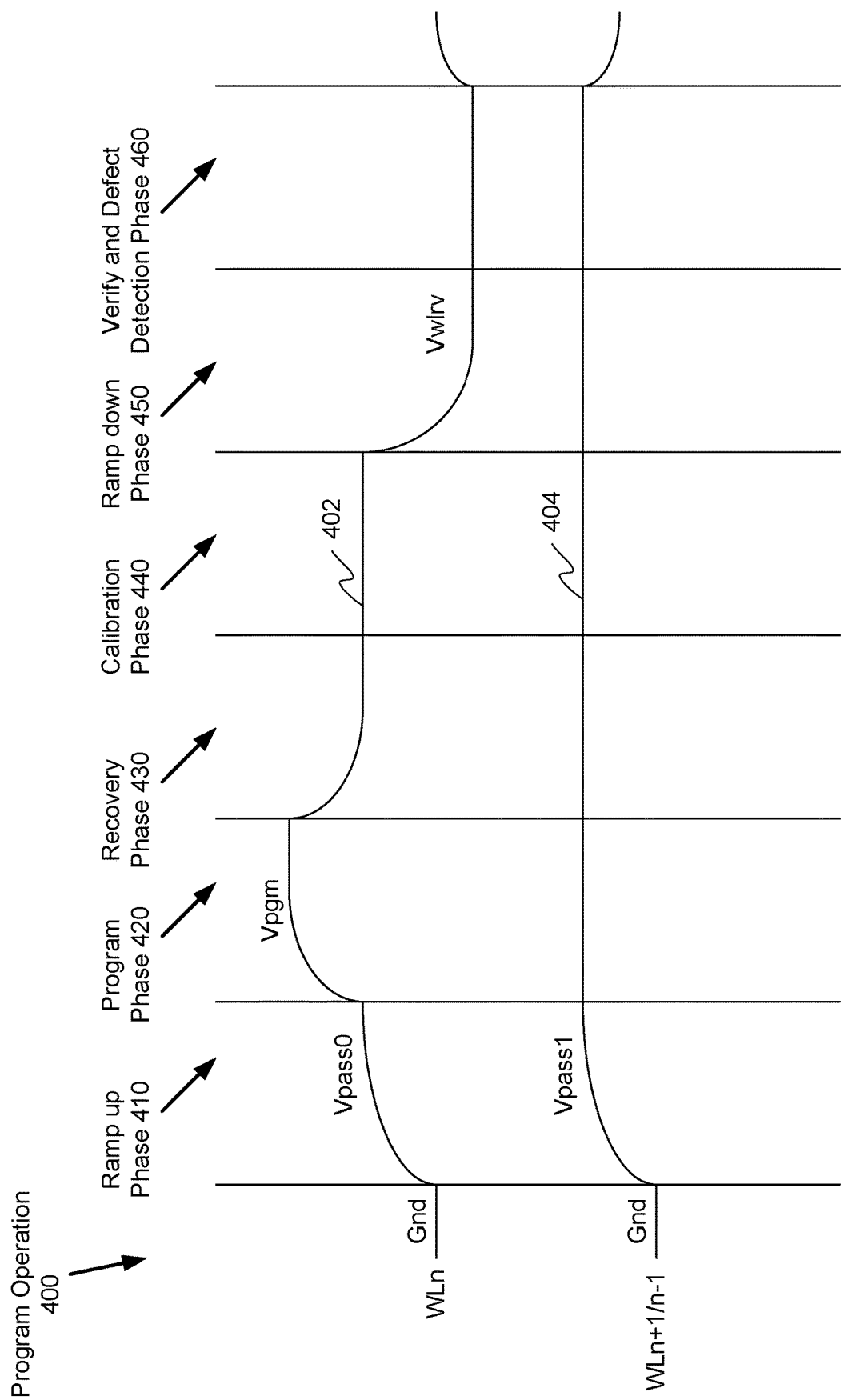
FIG. 4 is a timing diagram for operation of a memory device with defect detection during a program operation, in accordance with some embodiments of the present disclosure.

FIG. 4 is a timing diagram 400 for operation of a memory device with defect detection during a program operation, in accordance with some embodiments of the present disclosure. During a programming operation performed on a non-volatile memory device, such as memory device 130, certain phases can be encountered, including a ramp up phase 410, a program phase 420, a recovery phase 430, a calibration phase 440, a ramp down phase 450 and a program verify and defect detection phase 460. Timing diagram 400 illustrates the various phases of a program operation, according to one embodiment. In this embodiment, different signals are applied to various wordlines in memory device 130 in each of the illustrated phases. During the ramp up phase 410, a pass voltage is applied to wordlines of the memory device 130 in order to boost the channel voltage of the associated channel. In one embodiment, a first pass voltage (e.g., Vpass0) is applied to a selected wordline WLn (i.e., the wordline on which a corresponding memory cell is being programed) and a second pass voltage (e.g., Vpass1) is applied to the adjacent wordlines WLn+1 and WLn−1 to the selected wordline WLn. Depending on the embodiment, the first pass voltage and the second pass voltage can be either the same voltage or different voltages. During the program phase 420, a program voltage (e.g., Vpgm) is applied to the selected wordline WLn of the memory device 130, in order to program a certain level of charge to the selected memory cells on the wordlines representative of a desired value. Since relatively high voltages are applied during the program phase 420, the recovery phase 430 allows the device to recover from the high voltage modes. In one embodiment, the adjacent wordlines WLn+1 and WLn−1 remain at the pass voltage (e.g., Vpass1) during the program phase 420 and recovery phase 430.

During the calibration phase 440, the voltage signal 402 applied to the selected wordline WLn remains at the level to which it settled (e.g., Vpass0 or some other voltage level) during the recovery phase 430. During the calibration phase 440, the defect detector component 150, including regulator circuit 240 is disconnected from the memory array 230 and thus is not influenced by any current on WLn resulting from the application of voltage signal 402. In one embodiment, regulator circuit 240 performs a calibration routine during the calibration phase 440 to establish a reference voltage. The reference voltage includes a reference output voltage of the regulator circuit 240 when the load current is not applied to the regulator circuit 240 (i.e., when regulator circuit 240 is disconnected from memory array 230). In one embodiment, at least one of regulator circuit 240 or comparator circuit 250 includes a storage component (e.g., a capacitor) to store the reference voltage until a detection routine is performed. Once the calibration routine is complete and a reference voltage has been determined and stored, in on embodiment, the voltage signal 402 can be reduced to a program verify voltage (e.g., Vwlrv) during ramp down phase 450. Ramp down phase 450 can last for a predetermined amount of time (e.g., measured by a timer/counter of local media controller 135) to allow the voltage signal 402 to settle at the program verify voltage. Although FIG. 4 illustrates the program verify voltage as being lower than the program voltage or pass voltage, the program verify voltage can have any possible value, depending on the embodiment. Thus, ramp down phase 450 does not necessarily require a transition to a lower regulated voltage than in the calibration phase 440.

After the predetermined amount of time expires, the program operation can enter the program verify and defect detection phase 460. During the program verify and defect detection phase 460, the voltage signal 402 remains at the program verify voltage and regulator circuit 240 performs a detection routine to sample a load current from the selected wordline of memory array 230 and generate a measured output voltage. The design of regulator circuit 240 can be such that the measured output voltage modulates with respect to the load current. Therefore, as the load current changes (e.g., decreases), the measured output voltage also proportionately changes (e.g., decreases). In one embodiment, regulator circuit 240 provides the reference voltage and the measured output voltage to comparator circuit 250 which can perform a comparison to determine a difference between the reference voltage and the measured output voltage. This difference can be expressed as a comparison result which can be interpreted by local media controller 135 to identify the presence of a defect on the selected wordline WLn. In one embodiment, the voltage signal 404 applied to adjacent wordlines WLn+1 and WLn−1 remains at a pass voltage during calibration phase 440, ramp down phase 450, and program verify and defect detection phase 460.

In another embodiment, the defect detection operations described herein can be performed as part of a read operation initiated on the memory device. For example, the read operation can include a calibration phase during which the defect detector component 150, including regulator circuit 240 is disconnected from the memory array 230 and thus is not influenced by any current on the selected wordline resulting from the application of read voltage signal. In one embodiment, regulator circuit 240 performs a calibration routine during the calibration phase 440 to establish a reference voltage. The reference voltage includes a reference output voltage of the regulator circuit 240 when the load current is not applied to the regulator circuit 240 (i.e., when regulator circuit 240 is disconnected from memory array 230). The read operation can further include a voltage ramping phase during which the voltage applied to the selected wordline reaches a predetermined read voltage level, as well as a read and defect detection phase. During the read and defect detection phase, regulator circuit 240 performs a detection routine to sample a load current from the selected wordline of memory array 230 generated as a result of application of the read voltage and generate a measured output voltage. In one embodiment, regulator circuit 240 provides the reference voltage and the measured output voltage to comparator circuit 250 which can perform a comparison to determine a difference between the reference voltage and the measured output voltage. This difference can be expressed as a comparison result which can be interpreted by local media controller 135 to identify the presence of a defect on the selected wordline.

Figure 5:
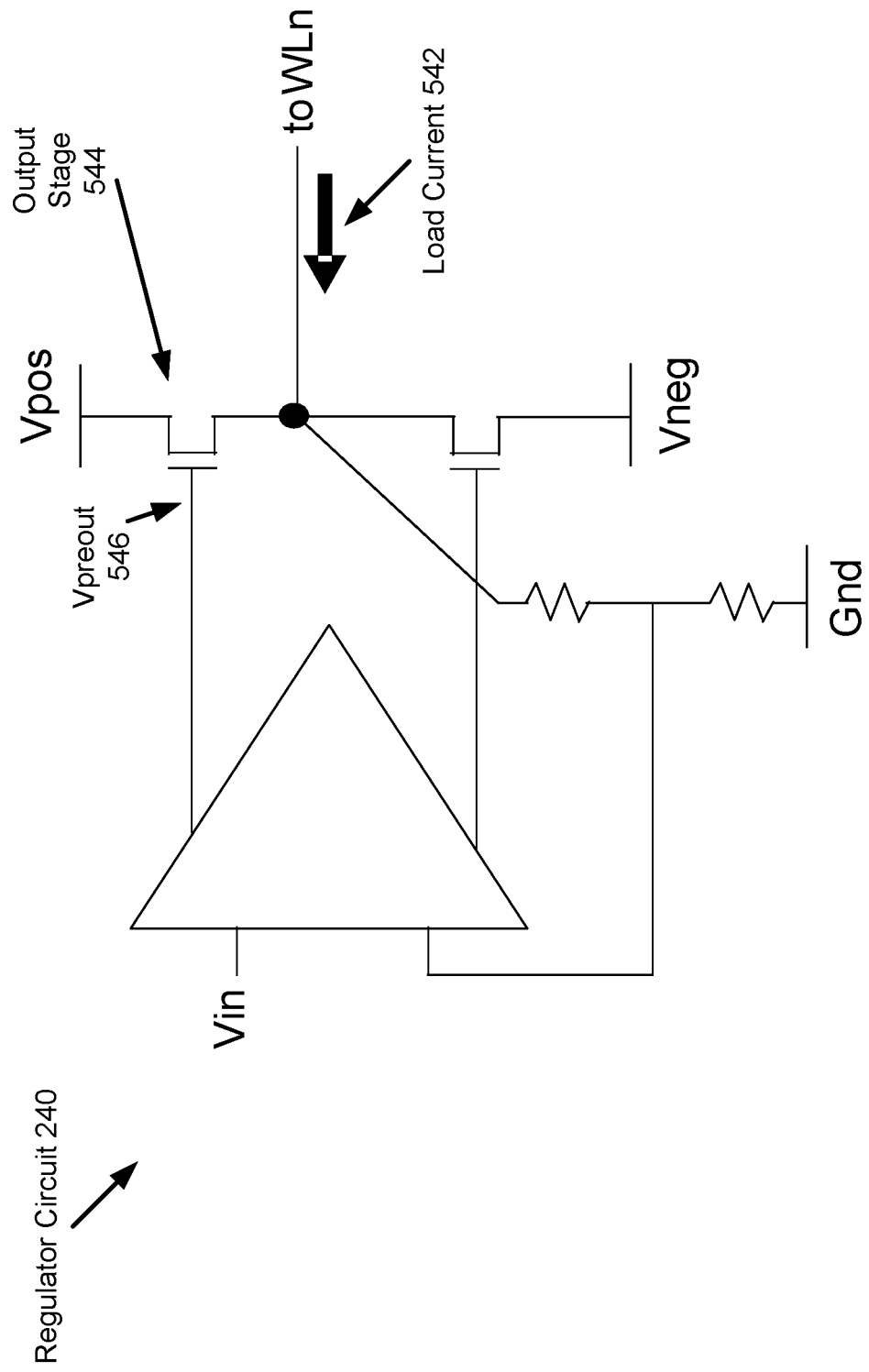
FIG. 5 is a circuit diagram illustrating a regulator circuit for defect detection in a memory device in accordance with some embodiments of the present disclosure.

FIG. 5 is a circuit diagram illustrating a regulator circuit 240 for defect detection in a memory device in accordance with some embodiments of the present disclosure. In one embodiment, regulator circuit 240 can be selectively coupled to any of the wordlines 232 of memory array 230 of memory device 130. In one embodiment, memory device 130 includes circuitry, such as one or switches, multiplexers, etc. (not shown), to enable regulator circuit 240 to sample a load current from any of the wordlines 232 of memory array 230 at different times. For example, when a program operation is being performed on memory cells corresponding to a selected wordline (e.g., WLn), regulator circuit 240 can be configured to receive a load current 542 from the selected wordline during the program verify phase of the program operation. The load current can result from the application of a program verify voltage (e.g., Vwlrv) to the selected wordline, but can potentially be impacted by leakage current resulting from a defect in the memory array 230. Thus, the value of load current 542 can indicate whether a defect is present on the selected wordline, such as an electrical short between the selected wordline (e.g., WLn) and an adjacent wordline (e.g., WLn+1 or WLn−1) of memory array 230.

In one embodiment, regulator circuit 240 includes a push-pull driver formed from a pair of active devices that alternately supply current to, or absorb current from the connected load (e.g., WLn). For example, the push-pull driver can be implemented using a complementary pair of transistors including one sinking current from the load to a negative power supply (e.g., Vneg) and another source follower component 544 supplying current to the load from a positive power supply (e.g., Vpos). In one embodiment, the measured output voltage (e.g., Vpreout 546) of regulator circuit 240 represents an operating point of a gate node of the output stage component 544. The design of regulator circuit 240 is such that Vpreout 546 modulates with respect to the load current 542. Therefore, as the load current 542 changes, Vpreout 546 also proportionately changes. When no load is connected to regulator circuit 240 (i.e., when load current 542 is zero), Vpreout 546 represents the reference voltage. When connected to the selected wordline (i.e., when load current 542 has some non-zero value), Vpreout 546 represents the measured output voltage of regulator circuit 240. As described herein, the reference voltage and measured output voltage can be provided to comparator circuit 250, which can perform a comparison to determine a difference between the reference voltage and the measured output voltage indicative of the presence of a defect on the selected wordline WLn. In other embodiments, some other design of regulator circuit 240 can be used.

FIGS. 6A-6C are circuit diagrams illustrating a comparator circuit for defect detection in a memory device in accordance with some embodiments of the present disclosure. Each of the comparator circuits illustrated in FIGS. 6A-6C can be representative of comparator circuit 250, as shown in FIG. 2.

In FIG. 6A, the comparator circuit includes a buffer 602 to receive the voltage Vpreout from regulator circuit 240. As described above, during the calibration routine, Vpreout can represent a reference voltage. Upon being buffered in buffer 602, a switch 604 can be enabled allowing the reference voltage to be stored in a storage component 606 (e.g., a capacitor). The reference voltage from storage component 606 is then provided as one input to a comparator 608. The other input to comparator 608 is a common mode voltage VCM, and the output of comparator 608 is a difference between the reference voltage and the common mode voltage VCM. This first result is provided to local media controller 135. During the detection routine, Vpreout from regulator circuit 240 can represent the measured output voltage of regulator circuit 240. Upon being buffered in buffer 602, switch 604 can be enabled allowing the measured output voltage to be stored in a storage component 606. The measured output voltage from storage component 606 is then compared to the common mode voltage by comparator 608. This second result is also provided to local media controller 135. Local media controller 135 can use comparison result that is based on a difference between the first result and the second result to identify whether a defect is present on the selected wordline WLn.

In FIG. 6B, the comparator circuit includes buffer 602 to receive the voltage Vpreout from regulator circuit 240. As described above, during the calibration routine, Vpreout can represent a reference voltage. Upon being buffered in buffer 602, a switch 610 can be enabled allowing the reference voltage to be stored in storage component 606. The reference voltage from storage component 606 is then provided as one input to a comparator 608. During the detection routine, Vpreout from regulator circuit 240 can represent the measured output voltage of regulator circuit 240. Upon being buffered in buffer 602, switch 610 can be enabled allowing the measured output voltage (e.g., Vmeasured) to be provided as a second input to comparator 608. The output of comparator 608 is a comparison result based on a difference between the reference voltage (e.g., Vref) and the measured output voltage. Local media controller 135 can use the comparison result to identify whether a defect is present on the selected wordline WLn.

In FIG. 6C, the comparator circuit is connected directory to memory array 230 and receives a load current (e.g., $I_{load}$) from the selected wordline WLn. A current sensor 612 measures the load current to determine a measured value (e.g., $I_{sense}$). This measured value is provided as one input to a comparator 608. The other input to comparator 608 is a reference value (e.g., $I_{ref}$), and the output of comparator 608 is a comparison result based on a difference between the measured value and the reference value. In one embodiment, the reference value represents a default value, such as an expected value of the load current from the selected wordline WLn when the program verify voltage is applied. Local media controller 135 can use the comparison result to identify whether a defect is present on the selected wordline WLn.

Figure 7:
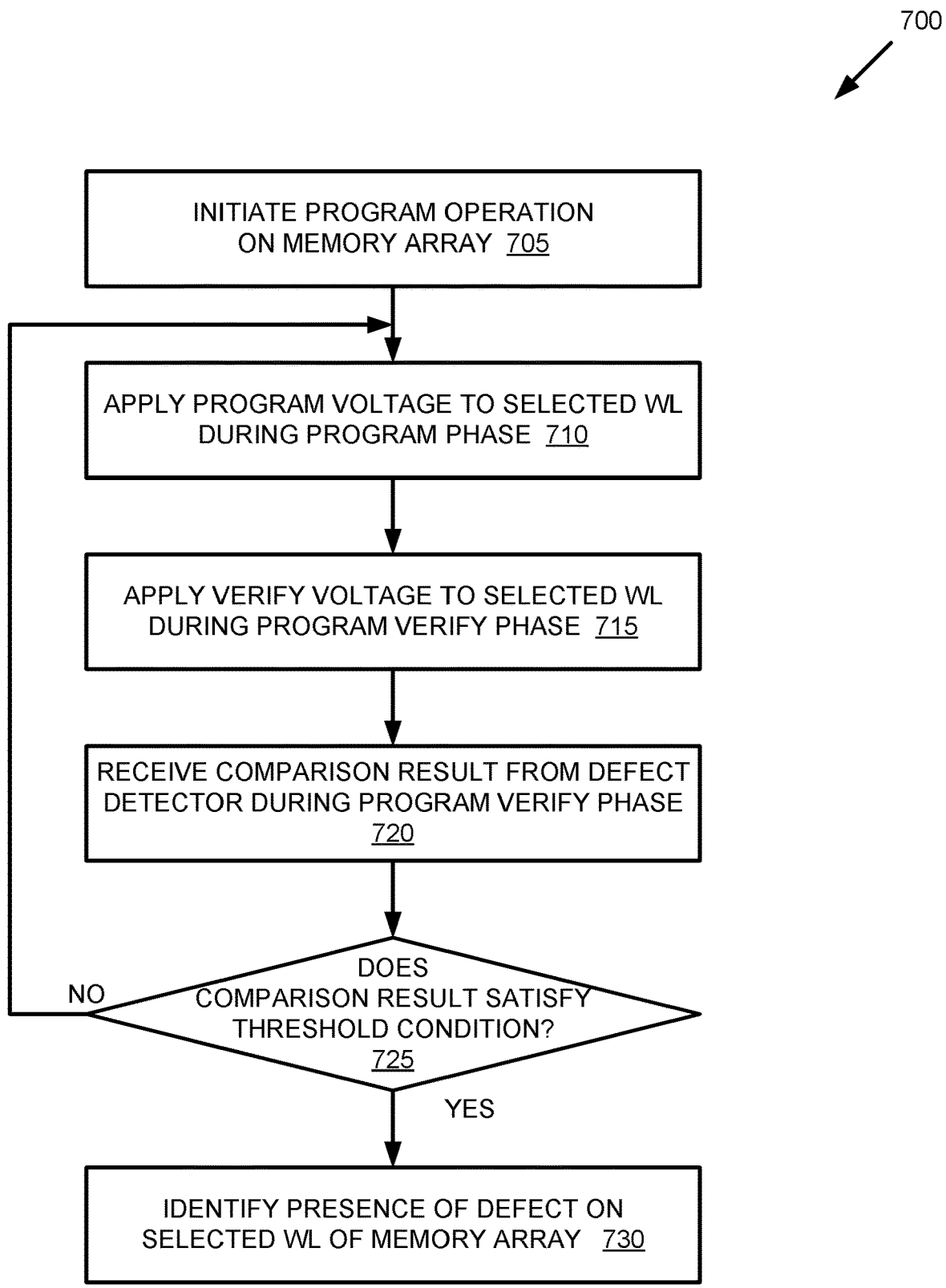
FIG. 7 is a flow diagram of an example method of defect detection during program verify in a memory sub-system in accordance with some embodiments of the present disclosure.

FIG. 7 is a flow diagram of an example method of defect detection during program verify in a memory sub-system in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by local media controller 135 and defect detector component 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, a program operation is initiated. For example, processing logic (e.g., local media controller 135) can initiate a program operation on a memory device 130. In one embodiment, the program operation includes a program phase and a program verify phase, among other possible phases. In certain embodiments, each of these phases can be repeated numerous times in a cycle during a single programming operation. In one embodiment, the program operation is initiated in response to a command received from memory sub-system controller 115 indicating to program data to memory device 130 in response to a request from host system 120 or as part of a memory management operation (e.g., garbage collection).

At operation 710, a program voltage is applied to a selected wordline WLn. For example, during the program phase, the processing logic causes a wordline driver to apply a program voltage to a selected wordline of the memory device 130, in order to program a certain level of charge to the selected memory cells on the wordline representative of a desired value.

At operation 715, a verify voltage is applied to the selected wordline WLn. For example, during the program verify phase, the processing logic causes a wordline driver to apply a program verify voltage to the selected wordline to read the level of charge stored at the selected memory cells to confirm that the desired value was properly programmed.

At operation 720, a comparison result is received. For example, during the program verify phase, the processing logic causes a regulator circuit 240 to sample a load current from the selected wordline WLn and generate a measured output voltage. In one embodiment, the measured output voltage modules with respect to the load current. A comparator circuit 250 generates the comparison result based on a difference between the measured output voltage and a reference voltage. In one embodiment, local media controller 135 receives the comparison result from comparator circuit 250.

At operation 725, a determination of whether the comparison result satisfies a threshold condition is made. For example, the processing logic can compare the comparison result to a threshold. The threshold can be some nominal amount set in order to prevent the false detection of defects in the memory array. In one embodiment, if the comparison result meets or exceeds the threshold, local media controller 135 can determine that the threshold condition is satisfied. Conversely, if the comparison result is less than the threshold, local media controller 135 can determine that the threshold condition is not satisfied. If the threshold condition is not satisfied, no defect is detected and the processing logic can return to operation 710 to continue the program operation.

If the threshold condition is satisfied, however, at operation 730, the presence of a defect is detected. For example, the processing logic can determine that a defect, such as a wordline to wordline short is present on the selected WLn. In one embodiment, if a wordline to wordline short is present in memory array 230, a leakage current that flows through the electrical short can cause the load current from the selected wordline to decrease, which can lead to a decrease in the measured output voltage of regulator circuit 240. Thus, the comparison result of the measured output voltage relative to the reference voltage will increase. This increase can cause the comparison result to exceed the threshold and thus satisfy the threshold condition indicating the presence of the defect. In response, local media controller 135 can take corresponding remedial action, such as retiring the corresponding block to prevent it from being used to store data in the future.

Figure 8:
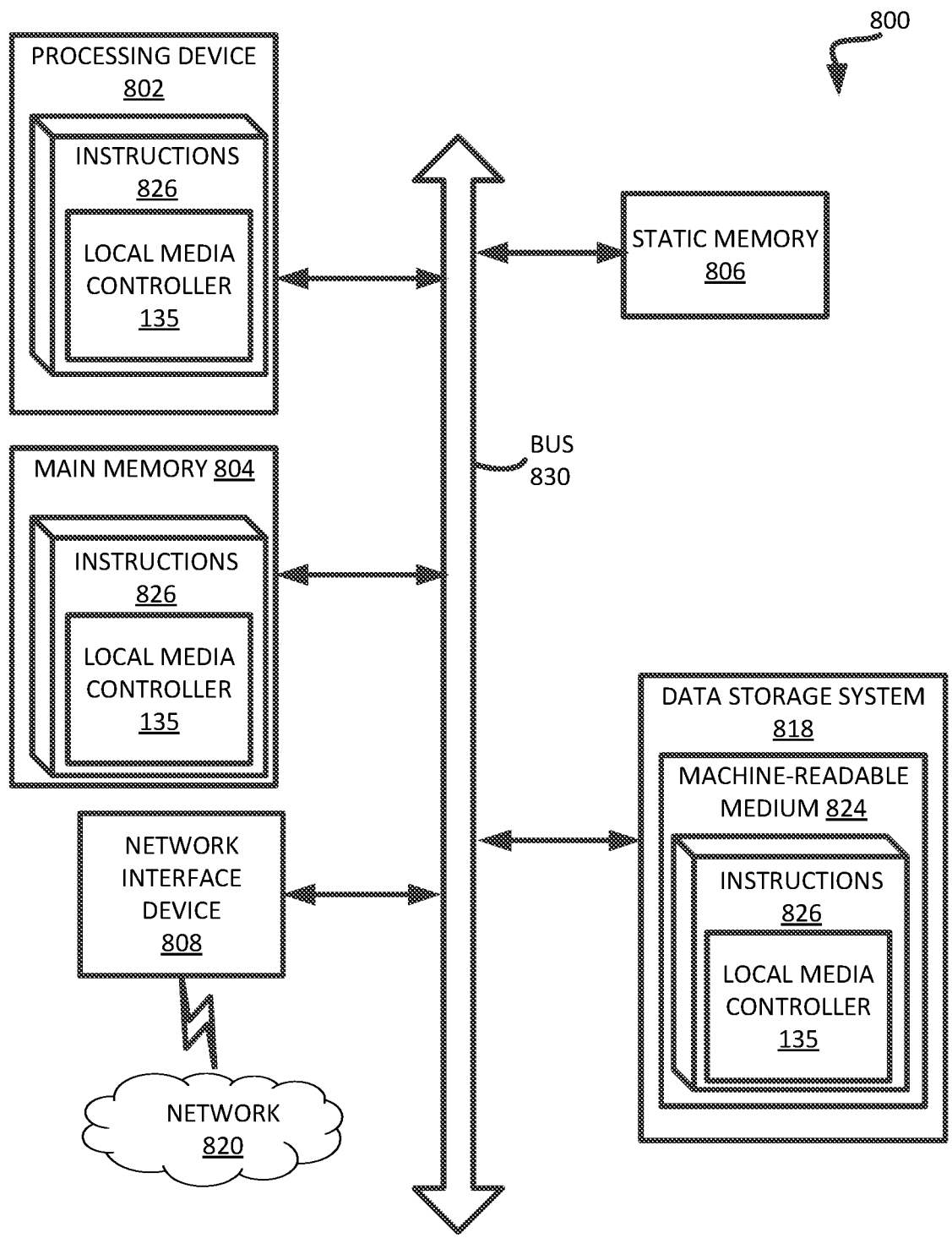
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to local media controller 135 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of wordlines;
   a regulator circuit selectively coupled to the plurality of wordlines, wherein the regulator circuit is configured to perform a detection routine to sample a load current from a selected wordline of the plurality of wordlines during a program verify phase of a program operation associated with the selected wordline and generate a measured output voltage, wherein the measured output voltage modulates with respect to the load current;
   a comparator circuit coupled to the regulator circuit, wherein the comparator circuit is configured to generate a comparison result based on a difference between the measured output voltage and a reference voltage; and
   a local media controller coupled to the comparator circuit, wherein the local media controller is configured to identify a presence of a defect on the selected wordline in response to the comparison result satisfying a threshold condition.

2. The memory device of claim 1, wherein the load current on the selected wordline is generated by a program verify voltage applied to the selected wordline.

3. The memory device of claim 1, wherein the regulator circuit is configured to perform a calibration routine to establish the reference voltage, wherein the reference voltage comprises a reference output voltage of the regulator circuit when the load current is not applied to the regulator circuit, and wherein the comparator circuit comprises a storage component to store the reference voltage until the detection routine is performed.

4. The memory device of claim 1, wherein the regulator circuit comprises a push-pull driver comprising an output stage component, and wherein the measured output voltage represents an operating point of a gate node of the output stage component.

5. The memory device of claim 1, wherein the comparator circuit is configured to compare the measured output voltage of the regulator circuit to the reference voltage to generate the comparison result.

6. The memory device of claim 1, wherein the comparator circuit is configured to compare the reference voltage to a common mode voltage to generate a first result and to compare the measured output voltage of the regulator circuit to the common mode voltage to generate a second result, wherein the comparison result is based on a difference between the first result and the second result.

7. The memory device of claim 1, wherein the local media controller is configured to identify the presence of a defect on the selected wordline when the comparison result indicates that the measured output voltage is less than the reference voltage by at least a threshold amount.

8. The memory device of claim 1, wherein the defect on the selected wordline comprises an electrical short between the selected wordline and an adjacent wordline of the plurality of wordlines in the memory array.

9. A method comprising:
   initiating a program operation on a memory device, the program operation comprising a program phase and a program verify phase;

applying a program voltage to a selected wordline of a plurality of wordlines of a data block of the memory device during the program phase to program data to a memory cell corresponding to the selected wordline;

applying a verify voltage to the selected wordline during the program verify phase to read the data from the memory cell; and measuring a load current from the selected wordline during the program verify phase, wherein the load current indicates whether a defect is present on the selected wordline.

10. The method of claim 9, further comprising:

comparing the load current to a reference value, wherein a difference between the load current and the reference value indicates whether the defect is present on the selected wordline.

11. The method of claim 9, further comprising:

generating a measured voltage based on the load current, wherein the measured voltage modulates with respect to the load current; and comparing the measured voltage to a reference voltage, wherein a difference between the measured voltage and the reference voltage indicates whether the defect is present on the selected wordline.

12. The method of claim 11, wherein generating the measured voltage comprises applying the load current to a regulator circuit of the memory device, and wherein the measured voltage comprises an output of the regulator circuit.

13. The method of claim 12, wherein the reference voltage comprises the output of the regulator circuit when the load current has a default value.

14. The method of claim 9, wherein the defect on the selected wordline comprises an electrical short between the selected wordline and an adjacent wordline of the plurality of wordlines of the data block.

15. A memory device comprising:
a memory array comprising a plurality of wordlines;
a defect detector component operatively coupled with the memory array; and
a processing device, operatively coupled with the memory array and the defect detector component, to perform operations comprising:
  initiating a program operation on the memory array, the program operation comprising a program phase and a program verify phase;
  causing a program voltage to be applied to a selected wordline of the plurality of wordlines during the program phase to program data to a memory cell corresponding to the selected wordline;
  causing a verify voltage to be applied to the selected wordline during the program verify phase to read the data from the memory cell; and
  determining whether a defect is present on the selected wordline based on a comparison result received from the defect detector component, wherein the comparison result is based on a load current from the selected wordline measured during the program verify phase.

16. The memory device of claim 15, wherein the defect detector comprises:
a regulator circuit selectively coupled to the plurality of wordlines of the memory array; and
a comparator circuit coupled to the regulator circuit and configured to generate the comparison result.

17. The memory device of claim 16, wherein the comparison result is based on difference between a measured output voltage of the regulator circuit and a reference voltage.

18. The memory device of claim 15, wherein determining whether a defect is present on the selected wordline comprises determining whether the comparison result satisfies a threshold condition.

19. The memory device of claim 15, wherein memory array comprises a plurality of memory planes, and the memory device further comprises a plurality of defect detector components, wherein each of the plurality of defect detector components corresponds to one of the plurality of memory planes.

* * * * *